US011705264B2

(12) United States Patent
Friebe

(10) Patent No.: US 11,705,264 B2
(45) Date of Patent: Jul. 18, 2023

(54) LC FILTER ARRANGEMENT AND ELECTRICAL OR ELECTRONIC DEVICE HAVING SUCH AN LC FILTER ARRANGEMENT

(71) Applicant: SMA Solar Technology AG, Niestetal (DE)

(72) Inventor: Jens Friebe, Vellmar (DE)

(73) Assignee: SMA Solar Technology AG, Niestetal (DE)

( * ) Notice: Subject to any disclaimer, the term of this patent is extended or adjusted under 35 U.S.C. 154(b) by 255 days.

(21) Appl. No.: 16/897,600

(22) Filed: Jun. 10, 2020

(65) Prior Publication Data

US 2020/0303111 A1    Sep. 24, 2020

Related U.S. Application Data

(63) Continuation of application No. PCT/EP2018/083230, filed on Nov. 30, 2018.

(30) Foreign Application Priority Data

Dec. 21, 2017  (DE) .................... 10 2017 131 045.2

(51) Int. Cl.
| | | |
|---|---|---|
| *H01F 17/06* | (2006.01) | |
| *H01F 17/04* | (2006.01) | |
| *H01F 27/29* | (2006.01) | |
| *H03H 7/42* | (2006.01) | |

(Continued)

(52) U.S. Cl.
CPC ......... *H01F 17/062* (2013.01); *H01F 17/045* (2013.01); *H01F 27/29* (2013.01); *H03H 7/0115* (2013.01); *H03H 7/1766* (2013.01); *H03H 7/427* (2013.01); *H03H 2001/005* (2013.01); *H03H 2001/0092* (2013.01)

(58) Field of Classification Search
CPC ...... H03H 7/427; H03H 7/0115; H01F 27/29; H01F 17/045; H01F 17/062
USPC ......................................... 333/175, 181, 185
See application file for complete search history.

(56) References Cited

U.S. PATENT DOCUMENTS

| | | | |
|---|---|---|---|
| 4,777,465 | A | 10/1988 | Meinel |
| 5,243,308 | A | 9/1993 | Shusterman |
| 2009/0160596 | A1 | 6/2009 | Yang |

(Continued)

FOREIGN PATENT DOCUMENTS

| | | |
|---|---|---|
| JP | H01302809 A | 12/1989 |
| JP | H06219047 A | 8/1994 |

(Continued)

OTHER PUBLICATIONS

International Search Report dated Mar. 12, 2019 in connection with PCT/EP2018/083230.

*Primary Examiner* — Rakesh B Patel
(74) *Attorney, Agent, or Firm* — Eschweiler & Potashnik, LLC

(57) ABSTRACT

An LC filter arrangement includes a filter capacitor that connects the first output terminal to the second output terminal, a magnetic core, and a choke having a plurality of turns surrounding the magnetic core, and a first choke terminal and a second choke terminal. Each of the turns is formed by a separate conductor segment, at least partially surrounding the magnetic core. The LC filter arrangement is mounted on a circuit board and is electrically connected to a conductor track of the circuit board.

20 Claims, 6 Drawing Sheets

(51) Int. Cl.
*H03H 7/01* (2006.01)
*H03H 1/00* (2006.01)

(56) References Cited

U.S. PATENT DOCUMENTS

| | | |
|---|---|---|
| 2013/0285763 A1 | 10/2013 | Granger-Jones |
| 2016/0172310 A1 | 6/2016 | Zhai |
| 2018/0115293 A1 | 4/2018 | Yamamoto |
| 2018/0166969 A1 | 6/2018 | Scheidermeier |
| 2018/0334046 A1* | 11/2018 | Lee .................... H02M 1/44 |

FOREIGN PATENT DOCUMENTS

| | | |
|---|---|---|
| JP | 2006013168 A | 1/2006 |
| JP | 2008172442 A | 7/2008 |

* cited by examiner

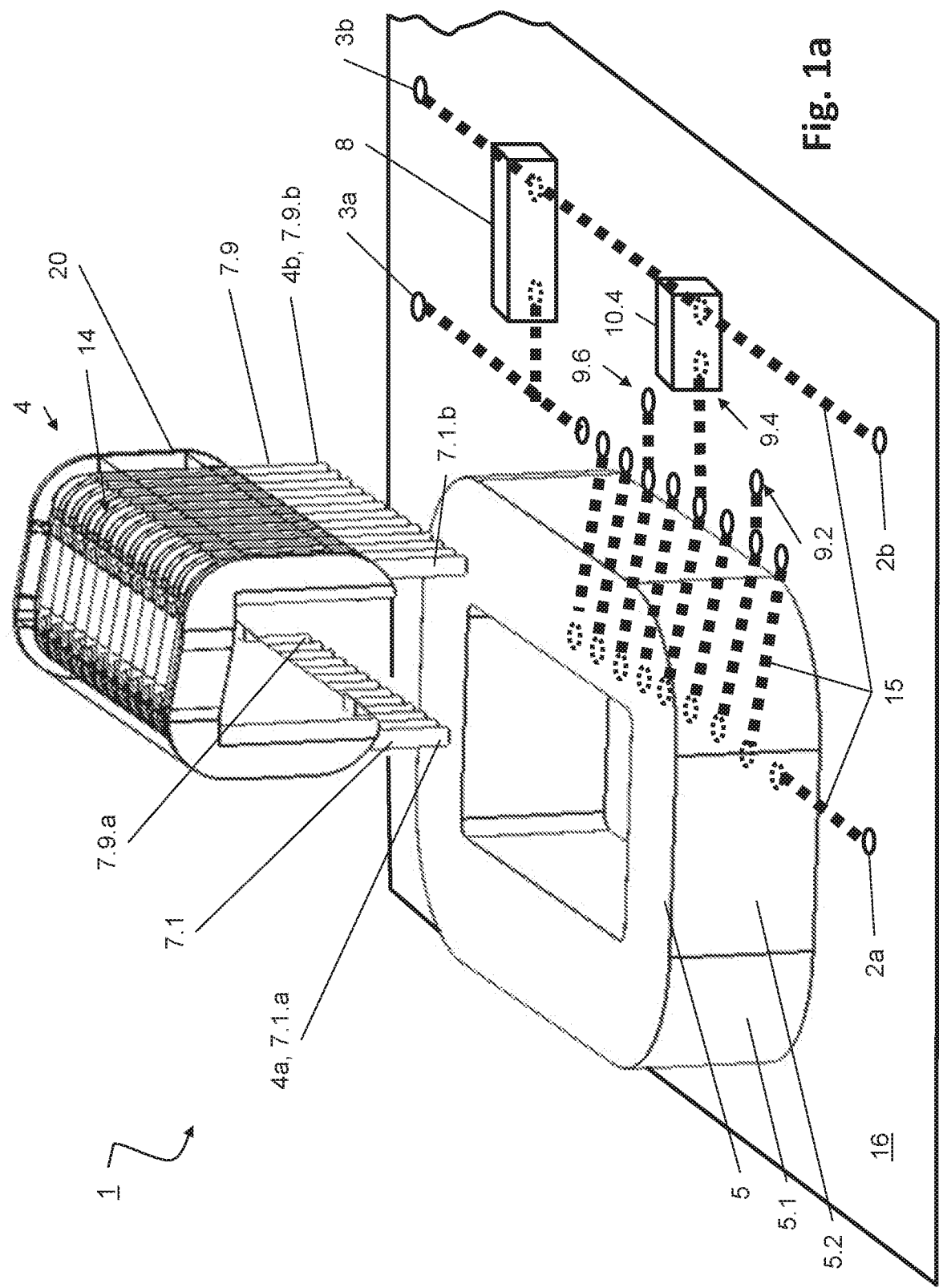

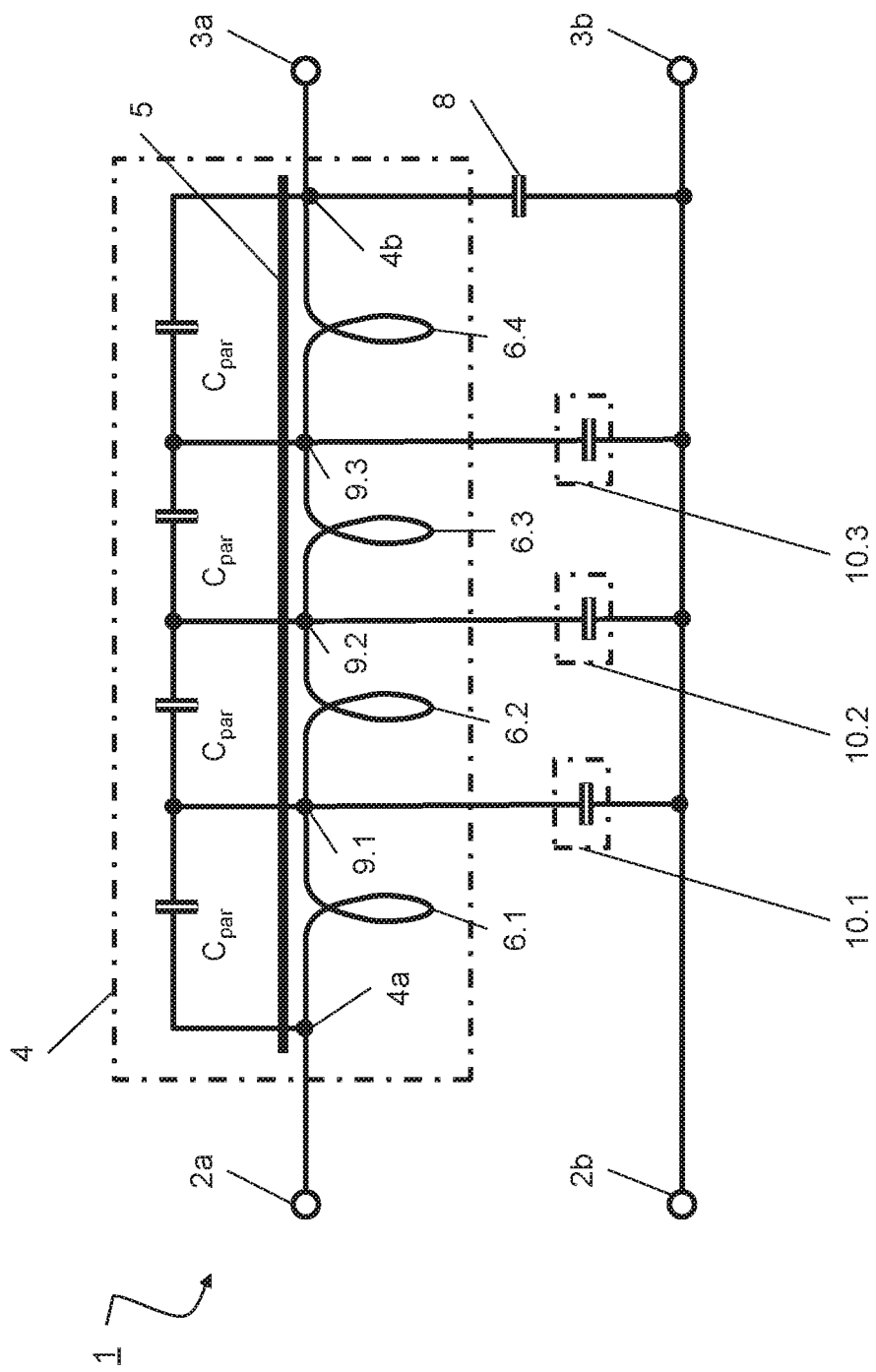

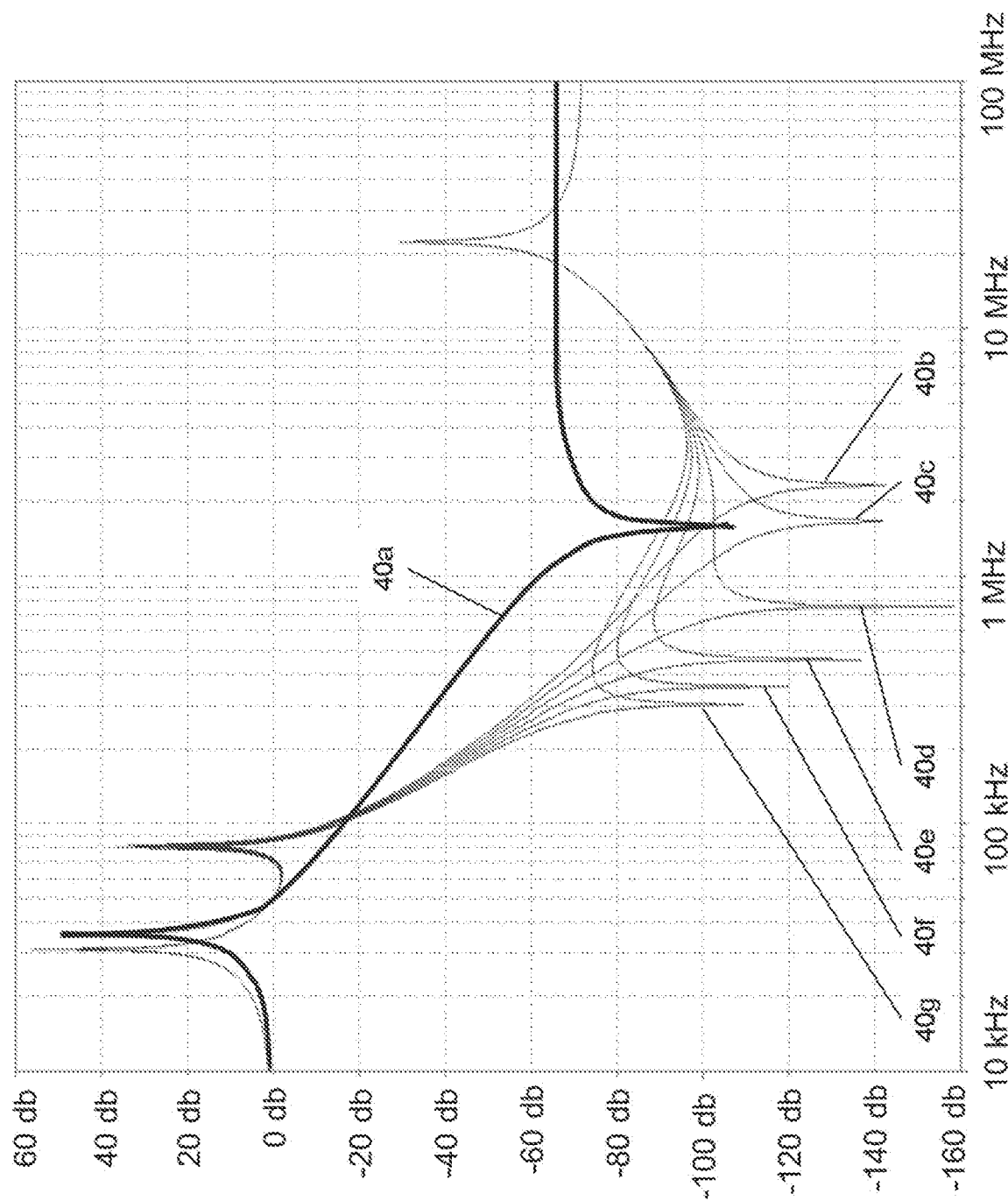

LC FILTER ARRANGEMENT AND ELECTRICAL OR ELECTRONIC DEVICE HAVING SUCH AN LC FILTER ARRANGEMENT

CROSS REFERENCE TO RELATED APPLICATIONS

This application is a continuation of International Patent Application number PCT/EP2018/083230, filed on Nov. 30, 2018, which claims priority to German Patent Application number 10 2017 131 045.2, filed on Dec. 21, 2017, and is hereby incorporated by reference in its entirety.

FIELD

The disclosure relates to an LC filter arrangement and to an electrical or electronic device having such an LC filter arrangement.

BACKGROUND

An electrical or electronic device is able, on the one hand, to capture interfering signals from the surroundings via components of the device that act as antennas. On the other hand, however, interfering signals may also be generated by the device itself, for example due to high-frequency switching operations. The interfering signals are generally undesired and may lead to incorrect operation in the device itself or in modules connected thereto. Appropriate measures are therefore taken to reduce both the reception and the forwarding of interfering signals by the device. By way of example, a permitted in-feed of high-frequency interfering signals from a photovoltaic (PV) inverter connected to an energy supply grid is limited by appropriate standards.

In order to reduce the capture of external interfering signals and/or the propagation of interfering signals present in the device, it is known to use LC filters at inputs or outputs of the device. A desired attenuation of the interfering signals in a particular frequency range is often, however, only able to be achieved using multi-stage LC filters. This is due firstly to the fact that a filter effect of a single-stage filter of usually 40 dB per decade is not sufficient to attenuate an interfering signal level in the relevant frequency range to the desired extent. Secondly, an ever-present stray turn-to-turn capacitance of a filter choke leads to a filter effect of the filter choke stagnating from frequencies above a limit frequency. Higher-frequency components of the interfering signal are, in this case, short-circuited via the inherently ever-present stray turn-to-turn capacitance of the filter choke.

Multi-stage LC filters comprise a cascaded interconnection of single-stage LC filters. They are usually more cost-intensive due to a higher number of components and take up a larger installation space, which again affects the costs of the device. A further cost factor is a complex—often manual—winding process of the chokes of conventional LC filters. At the same time, the winding process leads to only limited reproducibility—and thus to a large tolerance—of the filter parameters of different LC filters of the same type. It is difficult to subsequently adjust a filter effect of an LC filter once it has been designed. An LC filter optimized at least with regard to these properties is therefore desirable.

Document US 2009/0160596 A1 describes a magnetic device that comprises a circuit board, a magnetic induction element, an insulating structure and a plurality of conductive wire segments. The magnetic induction element covered by the insulating structure is arranged on the circuit board. The circuit board has a conductive layer, with two ends of each conductive wire segment being electrically connected to the conductive layer in order to form a coil loop.

Document DE 11 2016 002174 T5 discloses an interference filter having a printed circuit board on which a wiring pattern is formed, and a choke coil having a toroidal core. When the toroidal choke coil is viewed in plan view, a housing ground area is formed at a position of the printed circuit board that overlaps a hollow area of the choke coil. The interference filter furthermore comprises a capacitor whose first terminal is connected to the housing ground area by the wiring pattern.

Document DE 10 2016 224472 A1 discloses a rectifier device for a motor vehicle. A switching unit able to be operated at a predefined switching frequency is connected to an intermediate circuit of the rectifier device. A plurality of filter elements are connected in the intermediate circuit, each of which has an intermediate circuit capacitance. The filter elements are designed such that a minimum of the overall frequency response of a respective filter element lies within a frequency interval different from a respective minimum of the overall frequency response of the other filter elements. The frequency intervals in this case each have a harmonic of the switching frequency as the center frequency and an interval length corresponding to the switching frequency.

SUMMARY

The disclosure is directed to an LC filter arrangement which has easily reproducible filter properties in terms of its production. The LC filter arrangement is in this case intended to allow the filter effect to be adapted even at a relatively late stage in its production. At the same time, the LC filter arrangement should take up as little installation space as possible and should be particularly inexpensive to produce. The disclosure also provides an electrical or electronic device having such an LC filter arrangement.

An LC filter arrangement according to the disclosure is suitable for mounting on a circuit board having conductor tracks. The LC filter arrangement in this case comprises an input having a first and a second input terminal,
an output having a first and a second output terminal,
a filter capacitor that connects the first output terminal to the second output terminal,
a magnetic core, and
a choke having a plurality of turns surrounding the magnetic core, and a first and a second choke terminal.

Each of the turns is, in one embodiment, formed by way of a separate conductor segment, at least partially surrounding the magnetic core, each conductor segment having a first and a second end. When the LC filter arrangement is in a state mounted on the circuit board, the first and the second end are each electrically connected to a conductor track of the circuit board. In one embodiment, each of the conductor segments is arranged in a holder that has an electrically insulating material and is designed to position the conductor segments in a predefined position relative to one another and to electrically insulate them from the magnetic core. Furthermore, the second end of a conductor segment is electrically connected to the first end of an adjacent conductor segment. The first choke terminal is formed by a remaining first end of an outer conductor segment, while the second choke terminal is formed by a remaining second end of a further outer conductor segment. In one embodiment, the first choke terminal is electrically connected to the first input terminal and the second choke terminal is electrically connected to the first output terminal of the LC filter arrangement. The LC filter arrangement comprises the feature that the electrical connections of the conductor segments to one another—at least in a state in which the LC filter arrangement is mounted on the circuit board—have at least one tap, and wherein an additional impedance is connected to the at least one tap.

In one embodiment, the filter capacitor may, on the one hand, connect the first and the second output terminal to one another directly, that is to say without the interposition of further impedances. In this case, the filter capacitor is connected, by one of its contacts, directly to the choke output, and thus to an outer turn of the choke. However, it is also within the scope of the disclosure for the filter capacitor to connect the first and the second output terminal only indirectly, that is to say with the interposition of further impedances, such as for example a resistor, which are connected in series with the filter capacitor. The filter capacitor may, in one embodiment, also be connected, by one of its contacts, to a tap assigned to an inner turn of the choke.

Since the holder is designed in one embodiment to position the conductor segments in a predefined position relative to one another, high reproducibility is ensured in terms of the winding properties of the choke and thus in terms of the filter parameters of the LC filter arrangement. At the same time, this enables not only a highly reproducible but also a simple and inexpensive production of the LC filter arrangement. Specifically, the conductor segments are able to be positioned in the holder with a high degree of automation—and thus with a high throughput—at low cost. Mounting of the holder provided with the conductor segments on the circuit board, and thus completion of the choke winding or the choke turns, as well as completion of the entire LC filter arrangement, may be integrated into a usually highly automated circuit board production process without any difficulties. This also applies in particular to the electrical connection of the ends of the conductor segments to the corresponding conductor tracks of the circuit board, which may be performed for example via a soldering process that is present anyway in the circuit board production process. A tap, that is to say an electrical contact with individual turns or their conductor segments, is able to be easily produced through the electrical connection of the ends of the conductor segments. By way of example, such a tap or a plurality of such taps on different turns may be provided on the circuit board from the start through corresponding conductor tracks. The at least one impedance may be electrically connected to the at least one tap, via which impedance the filter effect is then able to be influenced and adapted in a targeted manner. When adapting the filter effect, it is advantageous that the turns are inductively coupled to one another via the magnetic core. As shown in connection with FIG. 2b, an adjustment may thus be made, for example with a suitable choice of the impedance and the associated tap, such that an otherwise inherent ever-present stray turn-to-turn capacitance of the choke is significantly reduced, ideally even eliminated. In one embodiment the filter effect may be adapted by distributing a plurality of taps on different turns of the choke, even at a relatively late stage in which a basic design of the LC filter arrangement has already been established. By way of example, taps may be provided on all of the turns without each of these taps necessarily having to be used to connect an impedance.

In one embodiment of the LC filter arrangement, the additional impedance has at least one of the following modules or a combination thereof:
 a capacitor,
 a series connection of a capacitor, a resistor and optionally an inductor, and
 a parallel connection of a capacitor and a resistor. The at least one tap is in this case advantageously connected to the second output terminal via the additional impedance.

In one embodiment of the LC filter arrangement, in addition to two outer conductor segments, the multiplicity of conductor segments comprise at least one inner conductor segment, for example, a plurality of inner conductor segments. The choke of the filter arrangement thus has more than just two (outer) turns. In such a case, the LC filter arrangement may also have a multiplicity of taps to each of which an additional impedance is connected. Each connection between two conductor segments of the choke may, for example, have a tap. A plurality, optionally each, of these taps may in this case each be connected to the second output terminal via an additional impedance. In this embodiment, the electrical connection of the second end of a conductor segment to the first end of an adjacent conductor segment may be provided for only some of the inner adjacent conductor segments, but also for each of the inner adjacent conductor segments. Specifically, in each case, the first end of a conductor segment may be electrically connected to the second end of a respectively preceding conductor segment, and the second end of the conductor segment may be electrically connected to the first end of a respectively following conductor segment.

In one embodiment of the LC filter arrangement, the second end of a conductor segment and the first end of a subsequent, adjacent conductor segment are each electrically connected to the same conductor track, for example, soldered thereto. In this case, the adjacent conductor segments are electrically connected via the same conductor track of the circuit board to which the ends of adjacent conductor segments are also electrically connected. Each of the conductor segments may in this case have a round or a rectangular cross section. Each of the conductor segments may, in one embodiment, comprise a bent area that corresponds to a U-shape with two limbs and a base associated with the U-shape. By virtue of such a U-shape, the conductor segment is designed to surround the magnetic core on three sides of its circumference. The magnetic core is enclosed on the fourth side, and the corresponding turn is thus completed, by the conductor track of the circuit board. The conductor segments of the choke may in this embodiment be connected to the conductor track(s) of the circuit board, in particular soldered thereto, using what is known as a through-hole technology (THT) process. As part of the THT process, those ends of the conductor segments that are arranged on the limbs of the U-shape are guided into corresponding holes in the circuit board. The conductor track may in this embodiment be arranged on a rear side, facing away from the choke, of the circuit board or else—for example in the case of multilayer circuit boards—in a central layer of the circuit board.

As an alternative to the U-shape, in one embodiment each of the conductor segments may also have a ring-shaped bend and surround the magnetic core on four sides of its circumference, even though it is not closed. The ring-shaped bend may at the same time have a helical offset, such that end faces of adjacent conductor segments face one another. In this embodiment, it is expedient to connect, for example, to solder, the conductor segments of the choke to the conductor track(s) of the circuit board using what is known as a surface mount device (SMD) process. In the SMD process, the conductor tracks are usually arranged on a side, facing the choke, of the circuit board or—in particular in the case of multilayer circuit boards—in a central layer of the circuit board. As an alternative, the end faces of a conductor segment may also face one another directly, and the electrical connection of adjacent conductor segments is achieved by way of a conductor track that is correspondingly offset directed or slant directed relative to its associated conductor segments.

In one embodiment of the LC filter arrangement, the magnetic core is formed by a closed magnetic core. The magnetic core may in this embodiment be constructed in one piece, that is to say contain only one core segment. As an alternative thereto, however, the magnetic core may also be composed of a plurality of core segments. The magnetic core may have one or more gaps. As an alternative thereto, it may also, however, be constructed without gaps. The magnetic core may be in a ring shape, for example, the shape of a torus or a rectangle.

In a further embodiment of the LC filter arrangement, the holder is designed to guide the conductor segments parallel to one another. The conductor segments may in this embodiment, on the one hand, each be guided parallel to one another over their entire length. This is the case for example when the magnetic core is a magnetic core with straight, that is to say non-bent, magnetic core sections and the holder is arranged on the straight or non-bent magnetic core sections. As an alternative, however, it is also possible for the holder to be designed to guide the conductor segments parallel to one another only over a fraction of their length. This may be the case with a bent, for example, ring-shaped magnetic core in connection with conductor segments bent in a u-shape or ring shape. In such an arrangement, it is possible for only two areas (located on the inner and outer circumference of the magnetic core) of the conductor segments to be guided parallel to one another, while the remaining areas, for example, a base of the area bent in a U-shape, are not aligned or guided parallel to one another.

In one embodiment, the filter capacitor may have only one filter capacitor. As an alternative thereto, however, it is possible for the filter capacitor to comprise a series connection of a plurality of, for example two, filter capacitors. In the latter cases, at least one of the taps may be connected to a center tap of the series connection of the filter capacitors via a further inductor or via a parallel connection of a further inductor and a further capacitor. This results, for example, as also shown in connection with FIG. 3a and FIG. 3b, in a further option for fine-tuning the LC filter arrangement.

In one embodiment, the LC filter arrangement has a further choke, which is, for example, structurally identical to the choke and surrounds the magnetic core. The further choke is in this embodiment connected to the second input terminal by way of its first choke terminal and to the second output terminal by way of its second choke terminal. In this embodiment, a contact of the filter capacitor is connected to an inner, in particular a central tap of the choke and another contact of the filter capacitor is connected to an inner, in particular a central tap of the further choke. A tap of the choke is furthermore connected to a corresponding tap of the further choke via the additional impedance. Optionally, a plurality of taps of the choke are each connected to matching corresponding taps of the further choke via an additional impedance. In a first variant of the LC filter arrangement embodiment, the winding directions of the choke and of the further choke are oriented relative to one another such that the LC filter arrangement is designed as a common-mode choke with regard to its filter function. In this variant, a first current flowing from the first input terminal to the first output terminal in conjunction with a second current flowing from the second input terminal to the second output terminal, which flows in synchronism with the first current, leads to a constructive superimposition of the magnetic fluxes generated by the currents. This variant accordingly results in attenuation of a common-mode signal, and the LC filter arrangement has a filter effect similar to a common-mode choke. By contrast, a first current flowing from the first input terminal to the first output terminal in conjunction with a second current flowing from the second input terminal to the second output terminal, which flows in differential-mode to the first current, leads to a destructive superimposition of the magnetic fluxes generated by the currents. differential-mode signals are therefore attenuated to a lesser extent or barely attenuated at all in this arrangement. As an alternative to the first variant, in a second variant of the embodiment, the winding directions of the choke and of the further choke are oriented relative to one another such that the LC filter arrangement is designed as a differential-mode choke with regard to its filter function. In the second variant, a first current flowing from the first input terminal to the first output terminal in conjunction with a second current flowing from the second input terminal to the second output terminal, which flows in differential-mode to the first current, leads to a constructive superimposition of the magnetic fluxes generated by the currents. This results in attenuation of the differential-mode signals, while common-mode signals are attenuated to a lesser extent or barely attenuated at all.

An electrical or electronic device according to the disclosure comprises an LC filter arrangement according to the disclosure. The device may be an inverter, in particular a photovoltaic (PV) inverter able to be connected to an energy supply grid for converting DC current into grid-compliant AC current. The LC filter arrangement according to the disclosure may in this case form at least part of a grid-side output filter of the inverter. As an alternative or in addition thereto, however, a DC-side input filter of the inverter may also have an LC filter arrangement according to the disclosure. This results in the advantages already listed in connection with the LC filter arrangement.

BRIEF DESCRIPTION OF THE DRAWINGS

The following text further explains and describes the disclosure with reference to preferred exemplary embodiments illustrated in the figures, in which:

FIG. 1a shows an exploded LC filter arrangement according to the disclosure and its arrangement on a circuit board having conductor tracks in a first embodiment designed for a THT process;

FIG. 2a shows a schematic depiction of a topology of the LC filter arrangement according to the disclosure in a third embodiment;

FIG. 2b shows simulation results for the frequency response of the LC filter arrangement according to FIG. 2a;

FIG. 3b shows simulation for the frequency response of the LC filter arrangement according to FIG. 3a.

DETAILED DESCRIPTION

Figure 1B:
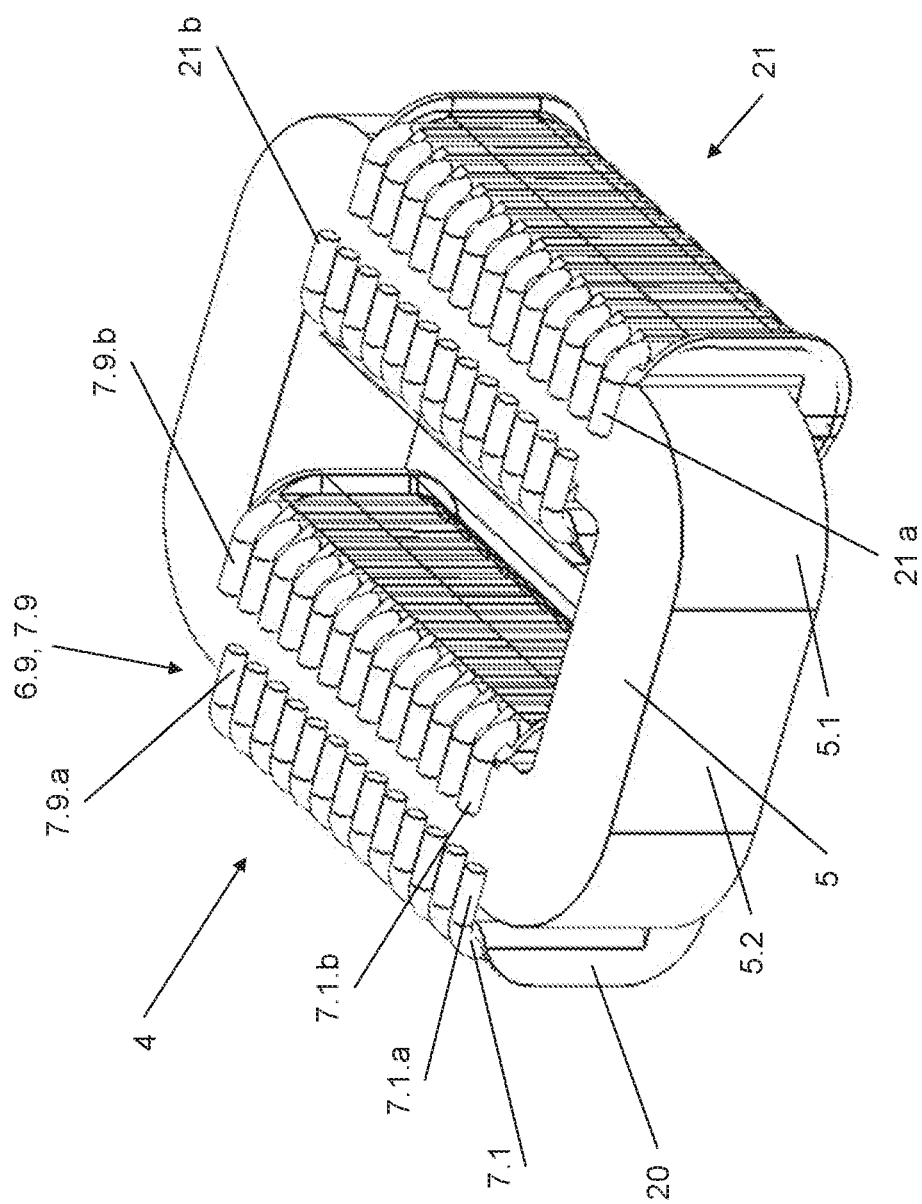
FIG. 1b shows a choke, designed for an SMD process, of the LC filter arrangement according to the disclosure in a second embodiment.

The disclosure relates to an LC filter arrangement and to an electrical or electronic device having such an LC filter arrangement. An LC filter arrangement should be understood to mean a circuit unit that reduces, ideally eliminates, the undesired interfering signal component from a mixture of a wanted signal and one or more interfering signals. The wanted signal should in the process be attenuated as little as possible. When reducing or attenuating interfering signals, use is made of a frequency-dependent impedance of both inductive and capacitive components. An LC filter arrangement is used for example as what is known as a sine filter at the output of a photovoltaic (PV) inverter connected at output to an energy supply grid, in order to prevent an undesirable level of interfering signals from being fed into the energy supply grid. The LC filter arrangement according to the disclosure in this case has a particularly high reproducibility in terms of its filter properties in comparison with conventional LC filter arrangements. The filter properties may also be adapted to a desired profile even at a relatively late stage in the production of the LC filter arrangement, the LC filter arrangement according to the disclosure being particularly inexpensive to produce.

FIG. 1a schematically illustrates a first embodiment of the LC filter arrangement 1 according to the disclosure and the arrangement thereof on a circuit board 16 in an exploded view. The LC filter arrangement 1 comprises a choke 4, which has a plurality of (here: 9 by way of example) turns in a state mounted on the circuit board 16. Each of the turns comprises a conductor segment 7.1-7.9 bent in a U-shape. The conductor segments 7.1-7.9 are arranged in a holder 20 made of electrically insulating material. The holder 20 is in this case designed to guide the conductor segments 7.1-7.9 parallel to one another and to fix them. The holder 20 is designed, together with the conductor segments 7.1-7.9 fixed therein, for arrangement on a magnetic core 5. For this purpose, the magnetic core 5 has by way of example a rectangular shape with bent 5.1 and non-bent magnetic core sections 5.2. When the LC filter arrangement 1 is mounted, first ends 7.1.a-7.9.a and second ends 7.1.b-7.9.b of the conductor segments 7.1-7.9 are inserted into corresponding holes in the circuit board 16. The holes are in this case each connected to one another in pairs via conductor tracks 15 that are arranged on a rear side of the circuit board 16 and are therefore shown in dashed form. An electrical connection (for example soldering) of the ends 7.1.a,b-7.9.a,b of the conductor segments 7.1-7.9 to the corresponding conductor tracks 15 results in closed turns of the choke 4 around the magnetic core 5. An outer first end 7.1.a of the choke 4 is electrically connected to a first input terminal 2a of the LC filter arrangement 1 via a conductor track 15. A remaining outer second end 7.9.b of the choke 4 is electrically connected to a first output terminal 3a of the LC filter arrangement 1. A second input terminal 2b is connected to a second output terminal 3b via a conductor track 15. A filter capacitor 8 is arranged on the circuit board 16 and connects the first output terminal 3a (here: directly) to the second output terminal 3b.

The LC filter arrangement 1 has a plurality of taps 9.2, 9.4, 9.6, each of which is connected to an electrical connection, created via a conductor track 15, between two corresponding conductor segments 7.2 and 7.3, 7.4 and 7.5, and 7.6 and 7.7. An additional impedance 10.4 that connects the tap 9.4 to the second output terminal 3b is connected to one of the taps 9.2, 9.4, 9.6 (here: 9.4). The additional impedance 10.4 in this case has a capacitor whose capacitance is selected such that it at least reduces the negative effects of the stray capacitances caused by the turns on the filter effect of the LC arrangement 1. This results in stronger attenuation of undesired interfering signals from the LC filter arrangement 1, in particular at higher frequencies.

Although the filter capacitor 8 in the illustrated embodiment connects the output terminals 3a, 3b directly and without the interposition of further impedances, an indirect electrical connection of the output terminals 3a, 3b via the filter capacitor 8 is however also possible within the scope of the disclosure. By way of example, further impedances may be connected in series with the filter capacitor 8. Specifically, the filter capacitor 8 may also be connected, by way of one of its contacts, to an inner tap 9.2-9.8 of the choke 4, provided that this inner tap 9.2-9.8 is different from the tap 9.4 to which the further impedance 10.4 is connected.

FIG. 1b shows a detailed view of a choke 4 and a further choke 21, each of which is mounted beforehand on a magnetic core 5 of a second embodiment of the LC filter arrangement 1. The circuit board 16 is not shown here for the sake of clarity. The second embodiment of the LC filter arrangement 1 with the choke 4 and the further choke 21 is configured, in a fully mounted state of the LC filter arrangement 1, to operate as a common-mode choke or as a differential-mode choke with regard to its filter effect depending on the orientation of a winding direction of the choke 4 and of the further choke 21. While the conductor segments 7.1-7.9 in the embodiment according to FIG. 1a are bent in a U-shape—and are therefore suitable for mounting on the circuit board 16 by way of a THT process—the conductor segments 7.1-7.9 in the embodiment according to FIG. 1b now have a ring-shaped bend. Each of the conductor segments 7.1-7.9 in this case encloses the magnetic core 5 on four sides of its circumference—although not completely. The conductor segments 7.1-7.9 additionally have a helically offset bend in the axial direction, which leads to ends of adjacent conductor segments 7.1-7.9 each facing one another at their end faces.

Such an arrangement of the conductor segments 7.1-7.9 is suitable for mounting on the circuit board 16 by way of an SMD process. In the SMD process, the pre-assembled arrangement of the choke 4, the further choke 21 and the magnetic core 5 with the opposing ends 7.1.a,b-7.9.a,b of the conductor segments 7.1-7.9 is positioned on corresponding conductor tracks 15 of the circuit board 16. The conductor tracks 15 are in this case arranged on a front side, facing the choke 4 or the further choke 21, of the circuit board 16 and are provided with a solder. During the SMD process, the solder is liquefied and the turns 6.1-6.9 of the choke 4 and of the further choke 21, which turns completely surround the magnetic core 5, are formed. The electrical connection of adjacent conductor segments 7.1-7.9 to one another is created here, as in the embodiment according to FIG. 1b, via the solder and/or the respective conductor tracks 15.

FIG. 2a illustrates a topology of a third embodiment of the LC filter arrangement 1 according to the disclosure, which serves as the basis for a simulation of the electrical properties of the LC filter arrangement 1, for example, its frequency response. The first input terminal 2a of the LC filter arrangement 1 is connected to the first output terminal 3a via a choke 4 that has a first and a second choke terminal 4b. The first output terminal 3a is connected to the second output terminal 3b via a filter capacitor 8. The second input terminal 2b is furthermore electrically connected to the second output terminal 3b.

In the example embodiment shown by way of example, the choke 4 has four turns 6.1-6.4. The turns 6.1-6.4 are inductively coupled to one another via the magnetic core 5 on which the choke 4 is arranged. In parallel with the turns 6.1-6.4 are sketched respectively corresponding, inherently ever-present stray capacitances Cpar of the choke 4. In conventional LC filters, the stray capacitances Cpar have the effect that high-frequency signals between the input terminals 2a, 2b are attenuated only to an insufficient extent, and are therefore still present at an undesirable level at the output terminals 3a, 3b.

In order to fine-tune the LC filter arrangement, for example with a view to suppressing the stray capacitances CPar and the associated effects, the LC filter arrangement 1 has taps 9.1-9.3 for each electrical connection of successive turns 6.1-6.4. Connected to the taps 9.1-9.3 are impedances 10.1-10.3—here by way of example each in the form of a capacitor—which connect each of the taps 9.1-9.3 to the second output terminal 3b. It is possible to optimize and/or fine-tune the LC filter arrangement 1 through a suitable choice of the impedances 10.1-10.3.

Figure 2B:
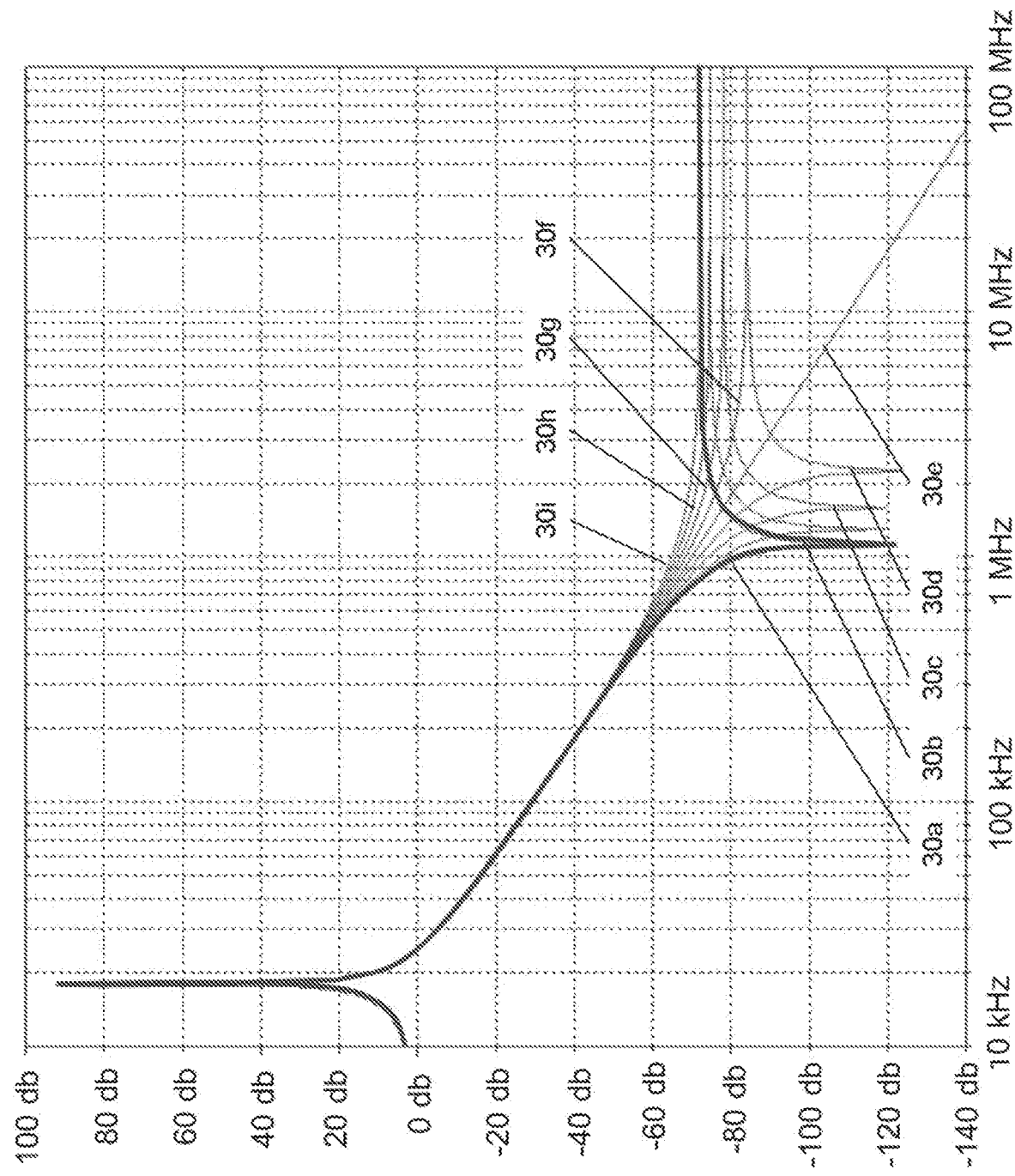

FIG. 2b shows simulation results for a frequency response of the LC filter arrangement from FIG. 2a for different capacitance values as impedances 10.1-10.3. In the simulation, the capacitances of the capacitor assigned to the first 10.1 and the third impedance 10.3 were chosen to be negligibly small. Only the capacitance of the capacitor assigned to the second impedance 10.2 was varied between a minimum and a maximum value in a plurality of discrete steps.

In the case of a small capacitance value of the capacitor connected to the second tap 9.2, the frequency response still corresponds to the typical frequency response of a real LC low-pass element, which is illustrated in FIG. 2b by the curve 30a plotted in bold. The increase in resonance at low frequencies in this case characterizes a preset resonant frequency of the LC filter arrangement, which results from the inductance of the choke 4 and the capacitance of the filter capacitor 8. At higher frequencies, there is a reduction in resonance, since a second resonance condition with regard to the inductance of the choke 4 and its stray capacitance CPar is satisfied there. No more additional attenuation of an input signal is present after this. The frequency response instead runs parallel to the abscissa.

As the capacitance of the capacitor connected to the second tap 9.2 increases, there is initially a shift in the reduction in resonance to higher frequencies. This is illustrated in FIG. 2b by the curves 30b, 30c and 30d. At a specific capacitance value of the capacitor assigned to the second impedance 10.2, the stray capacitances CPar of the choke 4 are almost completely compensated. In this case, the LC filter arrangement 1 also has increasing attenuation at higher frequencies, which is illustrated in FIG. 2b by the curve 30e. As the capacitance value of the capacitor connected to the second tap 9.2 increases further, the attenuation decreases again at high frequencies and approaches the curve 30a initially discussed there, but now without a reduction in resonance. This is shown in FIG. 2b by the curves 30f, 30g, 30h and 30i.

The chosen design of the LC filter arrangement 1, for example, the choice of the impedances 10.1-10.3 as capacitors, as well as the number of turns 6.1-6.3 of the choke 4 in this simulation is purely an example. Further simulations show that the frequency response illustrated by the curve 30e may also be achieved—at least approximately—via a different choice of impedances 10.1-10.3.

One advantage of the LC filter arrangement 1 is that the holder 20 provides good guidance of the conductor segments 7.1-7.9 relative to one another and, as a result, a specific geometry of the choke 4 is reproducible to a great extent. A specific type of choke 4, and therefore also specific predefined filter properties of the LC filter arrangement 1, are able to be reproduced very well and have only minimum scatter. The reproducibility of the filter properties of the LC filter arrangement 1 according to the disclosure is significantly better than is the case with conventional LC filter arrangements having chokes 4 that are often wound manually. By virtue of the taps 9.1-9.3 and a suitable choice of the impedances 10.1-10.3 connected thereto, it is possible to largely reduce undesirable effects in a frequency response of the LC filter arrangement 1, even in a late stage of production. Even small persisting deviations between different LC filter arrangements 1 of the same type are able to be adjusted easily by adding and/or changing impedances 10.1-10.3 at corresponding taps 9.1-9.3 in a targeted manner. The high reproducibility of the filter properties is in this embodiment advantageously linked with comparatively simple production of the LC filter arrangement 1. This also applies in the same way to the arrangement of the LC filter arrangement 1 shown in FIG. 3a.

Figure 3A:
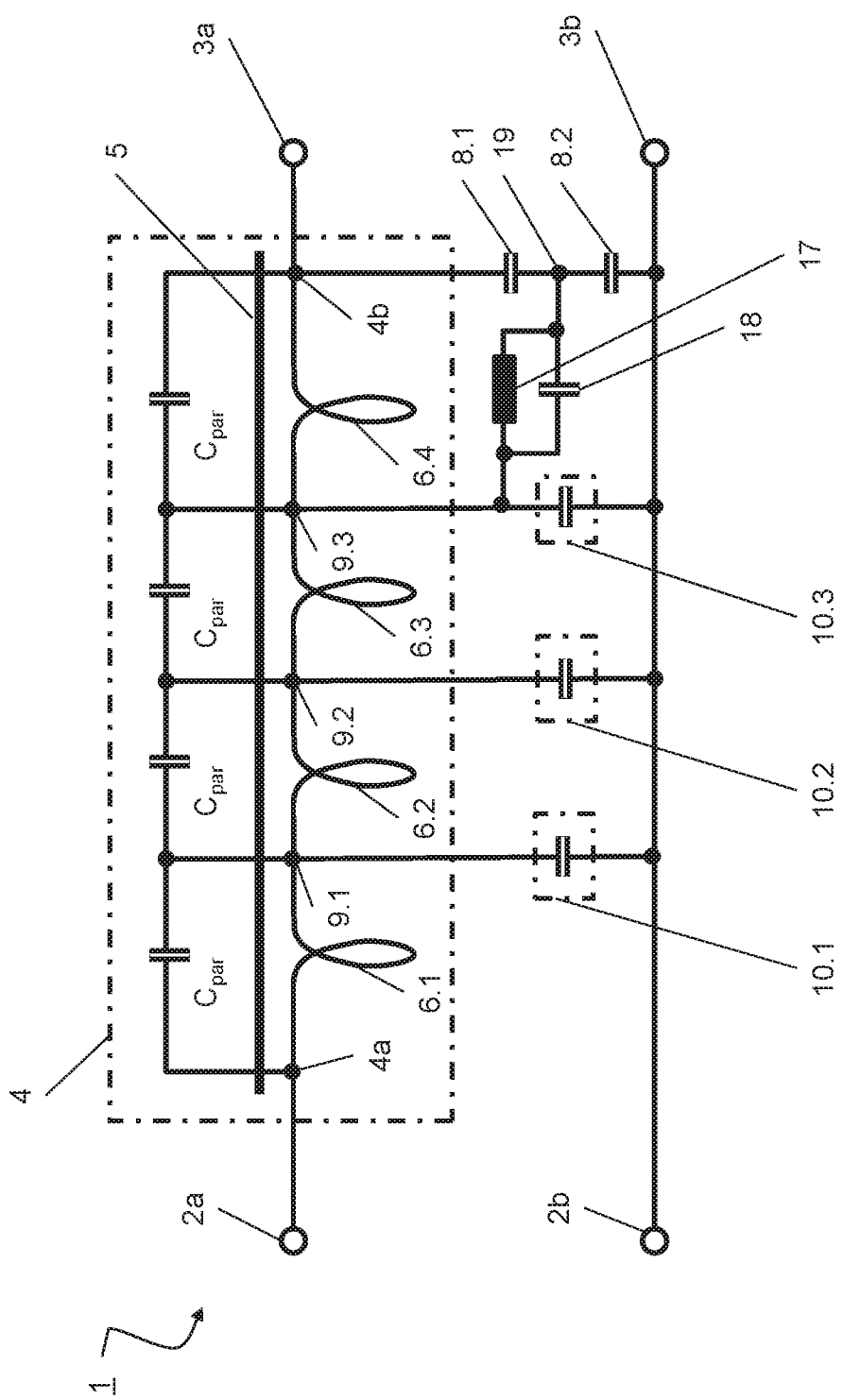
FIG. 3a shows a schematic depiction of a topology of the LC filter arrangement according to the disclosure in a fourth embodiment.

FIG. 3a shows a topology of the LC filter arrangement 1 according to the disclosure in a fourth embodiment. The topology largely resembles the embodiment of the LC filter arrangement 1 already shown in FIG. 2a, for which reason reference is made to the descriptions under FIG. 2a with regard to the matching aspects. In contrast to the variant shown in FIG. 2a, the filter capacitor 8 of the LC filter arrangement 1 according to FIG. 3a now, however, has a series connection of two filter capacitors 8.1, 8.2. A center tap 19 of the series connection of the two filter capacitors 8.1, 8.2 is connected to the third tap 9.3 of the LC filter arrangement 1 via a parallel connection of a further inductor 17 and a further capacitor 18.

FIG. 3b illustrates simulation results of the LC filter arrangement 1 in accordance with the topology shown in FIG. 3a in the form of different curves 40a-40g. Each of the curves in this case reproduces a frequency response of a simulation as a function of frequency. In the simulations, the first impedance 10.1 and the third impedance 10.3 were chosen in accordance with the arrangement discussed in FIG. 2a. For the second impedance 10.2, a capacitor with a capacitance value that corresponds to that of the curve 30e from FIG. 2b was selected. During the simulation, the first impedance 10.1, the second impedance 10.2, the third impedance 10.3 and the value of the further inductor 18 were kept constant. By contrast, the capacitance of the further capacitor 18 was varied between a minimum value and a maximum value in 6 discrete steps. As the capacitance of the further capacitor 18 increases, the frequency responses according to the illustrated curves 40b-40g thus result. For comparison, the curve 40a again represents the frequency response of an LC filter arrangement 1 that is free from impedances 10.1-10.3 connected to the taps 9.1-9.3, free from a further inductor 17 and free from a further capacitor 18.

The aim of this simulation is to design the LC filter arrangement 1 with the highest possible attenuation in a frequency range from 100 kHz to 1500 kHz. Depending on the specification of a limit value profile to be complied with, one of the curves 40b-40g or a capacitance value, associated with this curve 40b-40g, of the further capacitor 18 may be selected here in order to achieve the desired attenuation. In this case too, the very good reproducibility in terms of the production of the LC filter arrangement 1 is advantageous in order to minimize the scatter in the filter properties of LC filter arrangements 1 having a specific type of choke.

The invention claimed is:

1. An LC filter arrangement for mounting on a circuit board having conductor tracks, comprising:
   an input having a first input terminal and a second input terminal,
   an output having a first output terminal and a second output terminal,
   a filter capacitor that connects the first output terminal to the second output terminal,
   a magnetic core,
   a choke having a plurality of turns surrounding the magnetic core, and a first choke terminal and a second choke terminal,
      wherein each of the turns is formed by way of a separate conductor segment, at least partially surrounding the magnetic core, each conductor segment having a first end and a second end,
      wherein, when the LC filter arrangement is mounted on the circuit board, the first end and the second end of the conductor segments are each electrically connected to one of the conductor tracks of the circuit board,
      wherein each of the conductor segments is arranged in a holder which comprises an electrically insulating material and is configured to position the conductor segments in a predefined position relative to one another and to electrically insulate the conductor segments from the magnetic core, and wherein the holder together with the conductor segments fixed therein is configured to be arranged on the magnetic core,
      wherein the second end of a conductor segment is electrically connected to the first end of an adjacent conductor segment, and
      wherein the first choke terminal is formed by a remaining first end of an outer conductor segment and the second choke terminal is formed by a remaining second end of a further outer conductor segment,
   wherein the first choke terminal is electrically connected to the first input terminal and the second choke terminal is electrically connected to the first output terminal, and
   wherein the electrical connections of the conductor segments to one another have at least one tap associated therewith, wherein an additional impedance is connected to the at least one tap.

2. The LC filter arrangement as claimed in claim 1, wherein the additional impedance comprises at least one of the following modules or a combination thereof:
   a capacitor,
   a series connection of a capacitor, and a resistor,
   a series connection of a capacitor and a resistor and an inductor, and
   a parallel connection of a capacitor and a resistor.

3. The LC filter arrangement as claimed in claim 1, wherein in addition to two outer conductor segments, the plurality of conductor segments comprise at least one inner conductor segment.

4. The LC filter arrangement as claimed in claim 3, wherein the LC filter arrangement has a multiplicity of taps, wherein one or more of the multiplicity of taps is connected to a corresponding additional.

5. The LC filter arrangement as claimed in claim 1, wherein the at least one tap is connected to the second output terminal via the additional impedance.

6. The LC filter arrangement as claimed in claim 1, wherein the holder is configured to guide the conductor segments spatially parallel to one another.

7. The LC filter arrangement as claimed in claim 1, wherein each of the conductor segments has a round or rectangular cross section.

8. The LC filter arrangement as claimed in claim 1, wherein each of the conductor segments comprises a bent area that corresponds to a U-shape.

9. The LC filter arrangement as claimed in claim 8, wherein each of the conductor segments is bent in a ring shape that each exhibit an axial offset, such that end faces of adjacent conductor segments face one another.

10. The LC filter arrangement as claimed in claim 1, wherein the second end of a conductor segment and the first end of an adjacent conductor segment are electrically connected to the same conductor track, such that an electrical connection of adjacent conductor segments is created via the conductor track of the circuit board.

11. The LC filter arrangement as claimed in claim 10, wherein the conductor segments of the choke are connected to the circuit board using a through-hole technology (THT) process or using a surface mount device (SMD) process.

12. The LC filter arrangement as claimed in claim 1, wherein the magnetic core is formed by a closed magnetic core in the shape of a torus or a rectangle.

13. The LC filter arrangement as claimed in claim 1, wherein the filter capacitor is formed by a series connection of two filter capacitors.

14. The LC filter arrangement as claimed in claim 13, wherein at least one of the at least one tap is connected to a center tap of the series connection of the two filter capacitors via a further inductor, or via a parallel connection of a further inductor and a further capacitor.

15. The LC filter arrangement as claimed in claim 1,
   wherein the LC filter arrangement has a further choke, which is structurally identical to the choke and surrounds the magnetic core and that is connected to the second input terminal by way of a first further choke terminal and to the second output terminal by way of a second further choke terminal,
   wherein a contact of the filter capacitor is connected to an inner tap of the choke and another contact of the filter capacitor is connected to an inner tap of the further choke, and
   wherein the at least one tap of the choke is connected to a corresponding tap of the further choke via the additional impedance.

16. The LC filter arrangement as claimed in claim 15, wherein the winding directions of the choke and of the further choke are oriented relative to one another such that the LC filter arrangement is configured as a common-mode choke with regard to a filter function thereof.

17. The LC filter arrangement as claimed in claim 15, wherein the winding directions of the choke and of the further choke are oriented relative to one another such that the LC filter arrangement is configured as a differential mode choke with regard to a filter function thereof.

18. The LC filter arrangement as claimed in claim 1, wherein the filter capacitor is mounted on the circuit board.

19. The LC filter arrangement as claimed in claim 18, wherein the magnetic core is not disposed between the filter capacitor and the circuit board.

20. An electrical or electronic device comprising an inverter, having an LC filter arrangement, the LC filter arrangement comprising:
- an input having a first input terminal and a second input terminal,
- an output having a first output terminal and a second output terminal,
- a filter capacitor that connects the first output terminal to the second output terminal,
- a magnetic core,
- a choke having a plurality of turns surrounding the magnetic core, and a first choke terminal and a second choke terminal,
  - wherein each of the turns is formed by way of a separate conductor segment, at least partially surrounding the magnetic core, each conductor segment having a first end and a second end,
  - wherein, when the LC filter arrangement is mounted on the circuit board, the first end and the second end of the conductor segments are each electrically connected to one of the conductor tracks of the circuit board,
  - wherein each of the conductor segments is arranged in a holder which comprises an electrically insulating material and is configured to position the conductor segments in a predefined position relative to one another and to electrically insulate the conductor segments from the magnetic core, and wherein the holder together with the conductor segments fixed therein is configured to be arranged on the magnetic core,
  - wherein the second end of a conductor segment is electrically connected to the first end of an adjacent conductor segment, and
  - wherein the first choke terminal is formed by a remaining first end of an outer conductor segment and the second choke terminal is formed by a remaining second end of a further outer conductor segment,
- wherein the first choke terminal is electrically connected to the first input terminal and the second choke terminal is electrically connected to the first output terminal, and
- wherein the electrical connections of the conductor segments to one another have at least one tap associated therewith, wherein an additional impedance is connected to the at least one tap.

* * * * *